(12) United States Patent
Li et al.

(10) Patent No.: US 9,583,450 B2
(45) Date of Patent: Feb. 28, 2017

(54) METHOD FOR TRANSFERRING LIGHT-EMITTING ELEMENTS ONTO A PACKAGE SUBSTRATE

(71) Applicant: PLAYNITRIDE INC., Tainan (TW)

(72) Inventors: Yu-Chu Li, Tainan (TW); Yu-Hung Lai, Tainan (TW); Tzu-Yang Lin, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 0 days.

(21) Appl. No.: 14/886,567

(22) Filed: Oct. 19, 2015

(65) Prior Publication Data

US 2016/0111605 A1   Apr. 21, 2016

(30) Foreign Application Priority Data

Oct. 20, 2014   (TW) .............................. 103136144 A

(51) Int. Cl.
*H01L 21/00* (2006.01)
*H01L 23/00* (2006.01)

(52) U.S. Cl.
CPC ...... *H01L 24/00* (2013.01); *H01L 2933/0033* (2013.01)

(58) Field of Classification Search
CPC .......... H01L 24/00; H01L 24/04; H01L 24/12
See application file for complete search history.

(56) References Cited

U.S. PATENT DOCUMENTS

| | | | |
|---|---|---|---|
| 2009/0305443 A1* | 12/2009 | Chang | H01L 24/97 438/26 |
| 2013/0168708 A1* | 7/2013 | Shibata | H01L 25/0753 257/88 |

* cited by examiner

*Primary Examiner* — Richard Booth
(74) *Attorney, Agent, or Firm* — Muncy, Geissler, Olds & Lowe, P.C.

(57) ABSTRACT

A method for transferring light-emitting elements onto a package substrate includes: providing a light-emitting unit including a supporting substrate and a plurality of light-emitting elements, each of the light-emitting elements being removably connected to the supporting substrate and having a surface opposite to the supporting substrate; disposing the light-emitting unit spacingly above a package substrate in such a manner that the surface of each of the light-emitting elements faces the package substrate; and disconnecting the light-emitting elements from the supporting substrate to allow the light-emitting elements to fall onto the package substrate by gravity, so as to connect the light-emitting elements with the package substrate in a non-contact transferring method.

9 Claims, 6 Drawing Sheets

METHOD FOR TRANSFERRING LIGHT-EMITTING ELEMENTS ONTO A PACKAGE SUBSTRATE

CROSS-REFERENCE TO RELATED APPLICATION

This application claims priority of Taiwanese Patent Application No. 103136144, filed on Oct. 20, 2014.

FIELD

The disclosure relates to a method for transferring light-emitting elements onto a package substrate, more particularly to a non-contact method for transferring light-emitting elements onto a package substrate.

BACKGROUND

Referring to FIG. 1, a conventional display device includes a substrate 11, such as a printed circuit board or a thin-film transistor (TFT) substrate, and a plurality of pixel units 100. Each of the pixel units 100 includes a red light-emitting diode 12R, a green light-emitting diode 12G and a blue light-emitting diode 12B formed on the substrate 11 for respectively emitting red, green and blue light. FIG. 2 illustrates the formation of the pixel units 100 on the substrate 11. A temporary sapphire substrate 201 is utilized to allow a specific type of light-emitting diodes, such as red light-emitting diodes 12R, green light-emitting diodes 12G and blue light-emitting diodes 12B, to be formed thereon. Then, a multiple-transfer method was adopted to transfer the light-emitting diodes 12R, 12G, 12B onto the substrate 11, which is correspondingly formed with a plurality of solder pads 203. The light-emitting diodes 12R, 12G, 12B can be transferred onto the substrate 11 by pressing the temporary sapphire substrate 201 toward the substrate 11 with the light-emitting diodes 12R, 12G, 12B correspondingly adhered to the solder pads 203. Subsequently, the temporary sapphire substrate 201 can be removed using, for instance, laser lift-off techniques. However, since different kinds of light-emitting diodes may have different heights as shown in FIG. 2, pressure exerted on the substrate 11 due to the pressing action may be uneven and may result in unequal bonding strengths between the light-emitting diodes 12R, 12G, 12B and the substrate 11. Moreover, since the dimensions of the light-emitting diodes 12R, 12G, 12B have been gradually reduced with advancement of technology, precise alignment between the light-emitting diodes 12R, 12G, 12B and the solder pads 203 may become relatively difficult.

SUMMARY

Therefore, an object of the disclosure is to provide a method that can alleviate at least one of the aforesaid drawbacks of the prior art.

According to the disclosure, a method for transferring light-emitting elements onto a package substrate may include:

providing a light-emitting unit including a supporting substrate and a plurality of light-emitting elements, each of the light-emitting elements being removably connected to the supporting substrate and having a surface opposite to the supporting substrate;

disposing the light-emitting unit spacingly above a package substrate in such a manner that the surface of each of the light-emitting elements faces the package substrate; and disconnecting the light-emitting elements from the supporting substrate to allow the light-emitting elements to fall onto the package substrate by gravity, so as to connect the surface of each of the light-emitting elements with the package substrate due to the bonding pressure caused by the weight of light-emitting elements in a non-contact manner.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
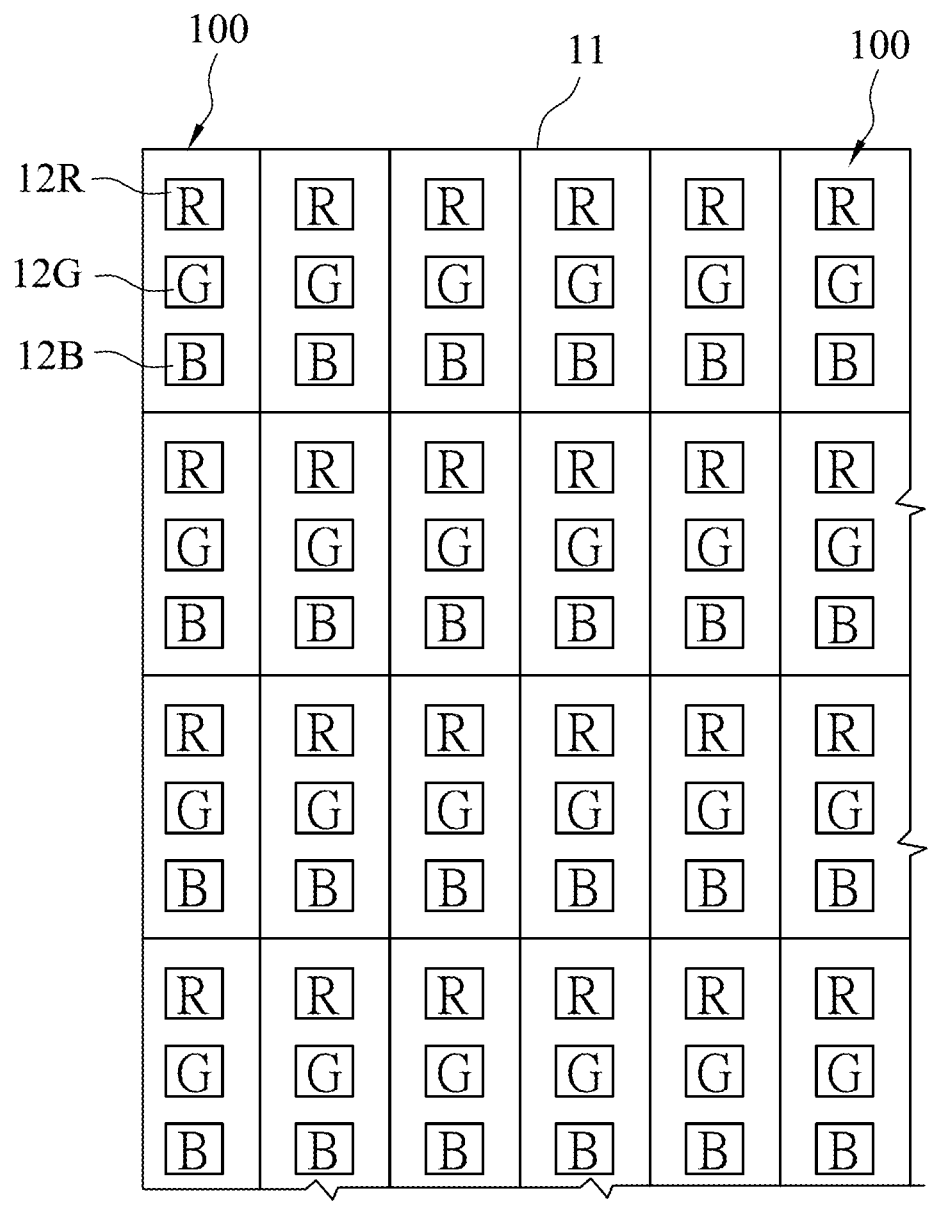
FIG. 1 is a schematic view of a conventional display device.
Figure 2:
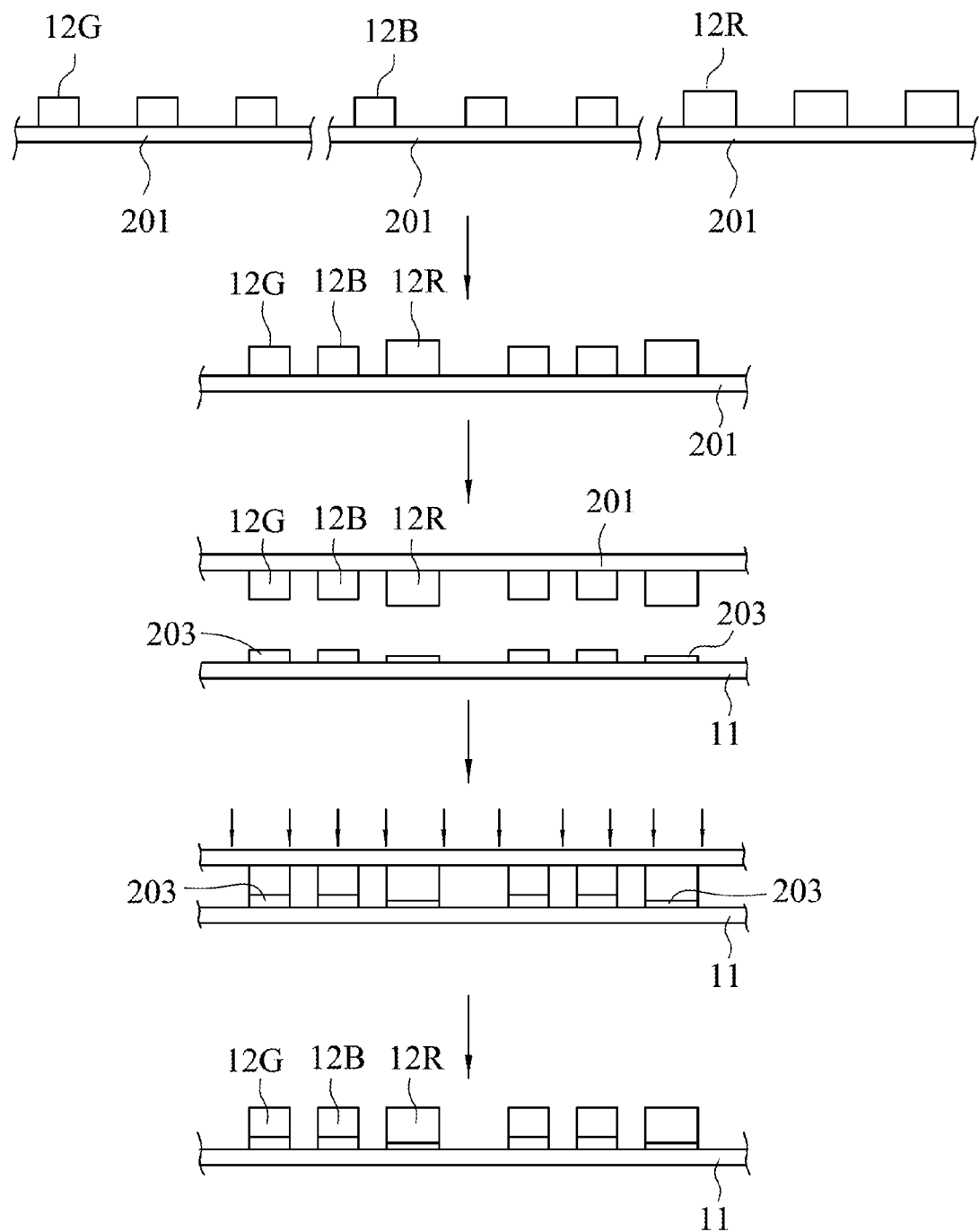
FIG. 2 is a schematic diagram illustrating consecutive steps of a conventional method for transferring light-emitting diodes onto a substrate.

Before the disclosure is described in greater detail, it should be noted that like elements are denoted by the same reference numerals throughout the disclosure.

Figure 3:
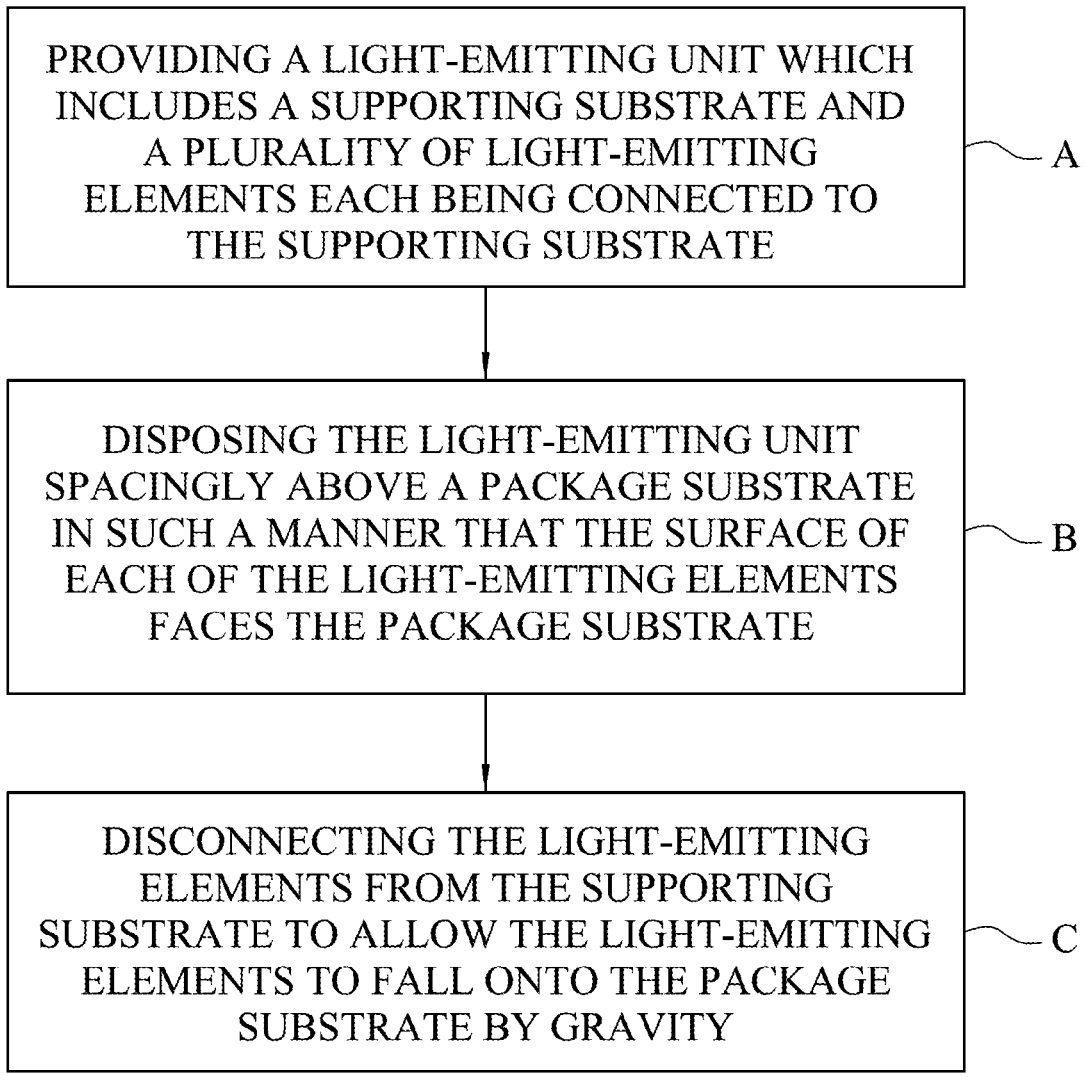
FIG. 3 is a flow chart of a first exemplary embodiment of a method for transferring light-emitting elements according to the present disclosure.
Figure 4:
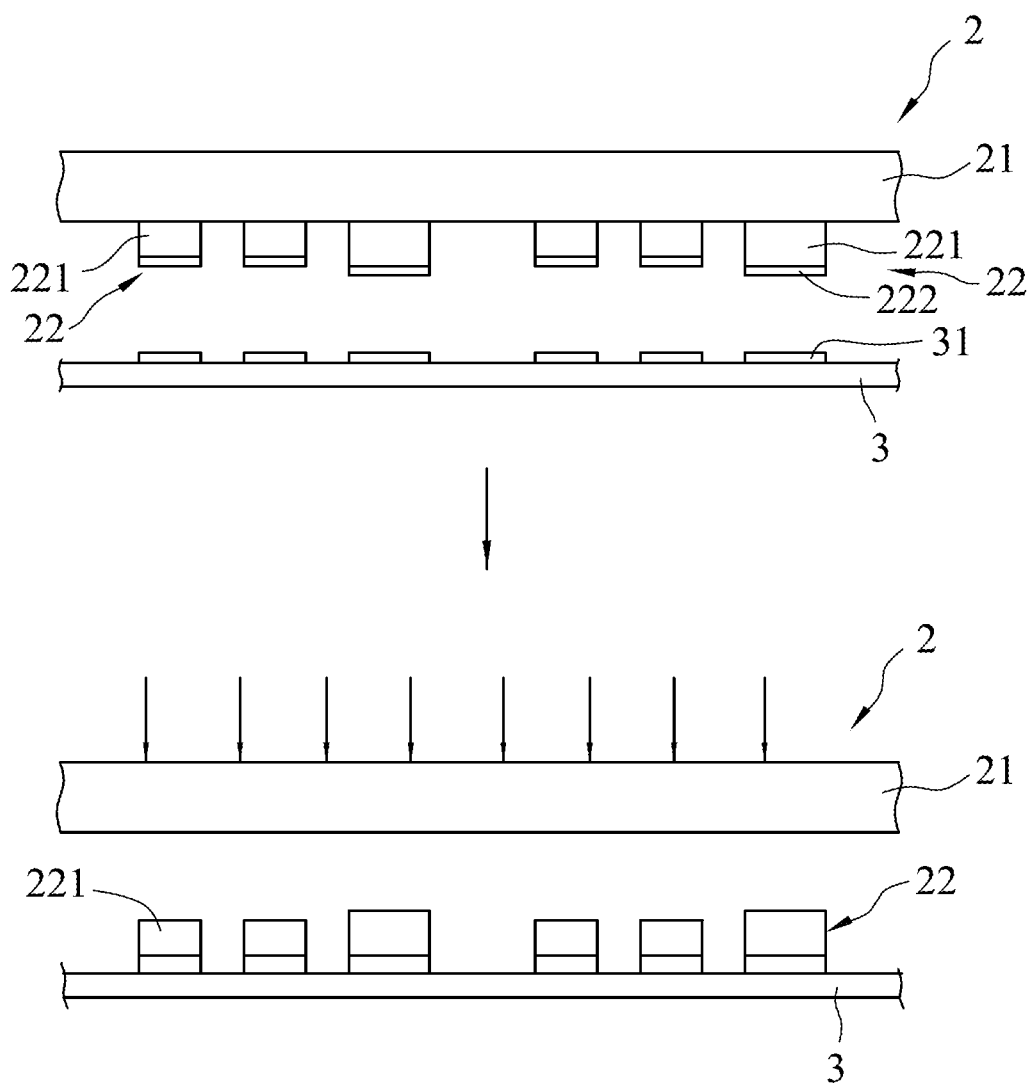
FIG. 4 is a schematic diagram illustrates consecutive steps of the first exemplary embodiment.

Referring to FIGS. 3 and 4, the first exemplary embodiment of a method for transferring light-emitting elements onto a package substrate is shown to include steps (A) to (C) as follows.

Step (A): providing a light-emitting unit 2. The light-emitting unit 2 includes a supporting substrate 21, and a plurality of light-emitting elements 22 each being connected to the supporting substrate 21. Examples of the supporting substrate 21 may be, but are not limited to, blue tapes, light release tapes, thermal release tapes, and substrates having magnetic characteristics. The supporting substrate 21 may also be a substrate made of glass, polycarbonate, acrylic or sapphire, and provided with light release tapes, thermal release tapes or blue tapes thereon. Alternatively, the supporting substrate 21 may be a substrate made of glass, polycarbonate, acrylic or sapphire and doped with a magnetic material. In this embodiment, the supporting substrate 21 is a light release tape which has a reduced adhesive strength after irradiation of a predetermined wavelength, for instance, a UV light having a wavelength less than 400 nm.

As shown in FIG. 4, each of the light-emitting elements 22 has a semiconductor structure 221 that is disposed on the supporting substrate 21 and that is operable to emit light within a predetermined wavelength range (i.e., to emit green, blue or red light), and an alloy layer 222 formed on the semiconductor structure 221 opposite to the supporting substrate 21. In greater detail, the light-emitting elements 22 are periodically disposed on the supporting substrate 21. In one embodiment, the light-emitting elements 22 may be arranged in a two-dimensional matrix on the supporting substrate 22.

It should be noted that each of the light-emitting elements 22 may have dimensions ranging from 1 µm to 100 µm. In certain embodiments, the light-emitting elements 22 may have dimensions ranging from 3 µm to 40 µm. It should be noted that the light-emitting elements 22 may have different heights from the supporting substrate 21. In other words, the light-emitting elements 22 include at least a first group of the light-emitting elements and a second group of the light-emitting elements having a height from the supporting substrate 21 that is different from that of the first group of the light-emitting elements 22. In certain embodiments, the spacing between two adjacent light-emitting elements 22 may range from 2 µm to 35 µm.

Step (B): disposing the light-emitting unit 2 spacingly above a package substrate 3 in such a manner that a surface of each of the light-emitting elements 22, which is opposite to the supporting substrate 21, faces the package substrate 3 (see FIG. 4).

In this embodiment, the package substrate 3 may be a printed circuit board (PCB), a thin film transistor (TFT) substrate, a complementary metal-oxide semiconductor (CMOS) substrate or a substrate having metal redistribution lines. In addition, the package substrate 3 may include an electrical connecting pattern (not shown) having a plurality of connecting elements 31 disposed correspondingly in position to the light-emitting elements 22 for enabling electrical connection between the light-emitting elements 22 and the package substrate 3. Each of the connecting elements 31 may be configured as a single-layered or multi-layered structure and made of an electrically-conductive material, such as a metal, a non-metal conductive material selected from graphite, graphene, conductive polymers or black phosphorus, or a combination of the metal and the non-metal conductive material. In this embodiment, the connecting elements 31 may be made of an alloy having a eutectic temperature ranging from 150° C. to 300° C. The alloy may be, for instance, AuSn, AlIn or AuIn.

Step (C): disconnecting the light-emitting elements 22 from the supporting substrate 21 to allow the light-emitting elements 22 to fall onto the package substrate 3 by gravity, so as to connect the surface of each of the light-emitting elements 22 with the package substrate 3 due to a bonding pressure caused by the weight of the light-emitting elements 22 (see FIG. 4).

To be specific, in this embodiment, Step (C) is conducted by irradiating the supporting substrate 21, which is a light release tape such as a UV tape, with the UV light so as to reduce the adhesive strength thereof to facilitate disconnection of the light-emitting elements 22 from the supporting substrate 21. In the meantime, the package substrate 3 may be heated up to a temperature above the eutectic temperature of the connecting elements 31 so as to melt the connecting elements 31, so that, after the falling of each of the light-emitting elements 22 onto a corresponding one of the connecting elements 31, the light-emitting elements 22 adhere to the connecting elements 31, and the connecting elements 31 may be cooled so as to interconnect the light-emitting elements 22 and the package substrate 3.

By utilizing the gravitationally falling of the light-emitting elements 22, the light-emitting elements 22 can be transferred to the package substrate 3 by the weight of light-emitting elements 22 in a non-contact manner. As such, pressing on the light-emitting elements 22 toward the package substrate 3 is not required for the non-contact transferring method of the present disclosure, and the problem due to the different heights of the light-emitting elements 22 can thus be prevented.

It should be noted that, in this embodiment, Step (C) may be conducted in a chamber (not shown) under a pressure that is less than 760 torr, so as to prevent misalignment of the light-emitting elements 22 with the connecting elements 31 due to external interference such as air flows. In certain embodiments, the pressure in the chamber may be less than 10 torr to further enhance precision of alignment between the light-emitting elements 22 and the connecting elements 31.

Figure 5:
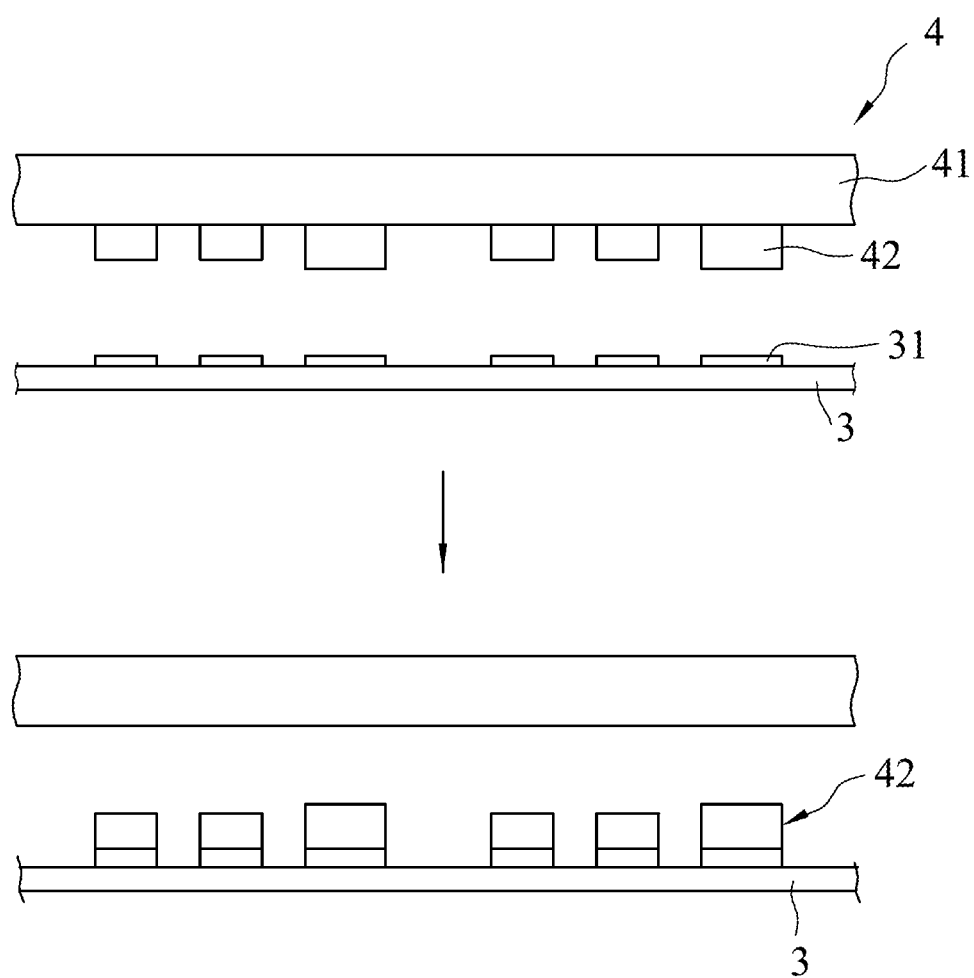
FIG. 5 is a schematic diagram illustrates consecutive steps of a second exemplary embodiment of a method for transferring light-emitting elements according to the present disclosure.

Referring to FIG. 5, the second exemplary embodiment of the method according to the present disclosure is shown to be similar to that of the first exemplary embodiment. The difference therebetween resides in that the light-emitting elements 42 of the second exemplary embodiment are connected to the supporting substrate 41 through magnetic attraction. For example, the supporting substrate 41 may be a substrate having magnetic characteristics, or a glass, PC, acrylic or sapphire substrate that is doped with magnetic materials. The light-emitting elements 42 may exhibit magnetic characteristics via a magnetic electrode (not shown) thereof or via a magnetic material doped within the semiconductor structure (not shown) thereof. As such, Step (C) of the method of the second exemplary embodiment may be conducted by diminishing the magnetic attraction between the supporting substrate 41 and the light-emitting elements 42 so as to disconnect the light-emitting elements 42 from the supporting substrate 41. In this embodiment, the magnetic attraction 42 may be diminished by demagnetizing either one or both of the supporting substrate 41 and the light-emitting elements 42.

Figure 6:
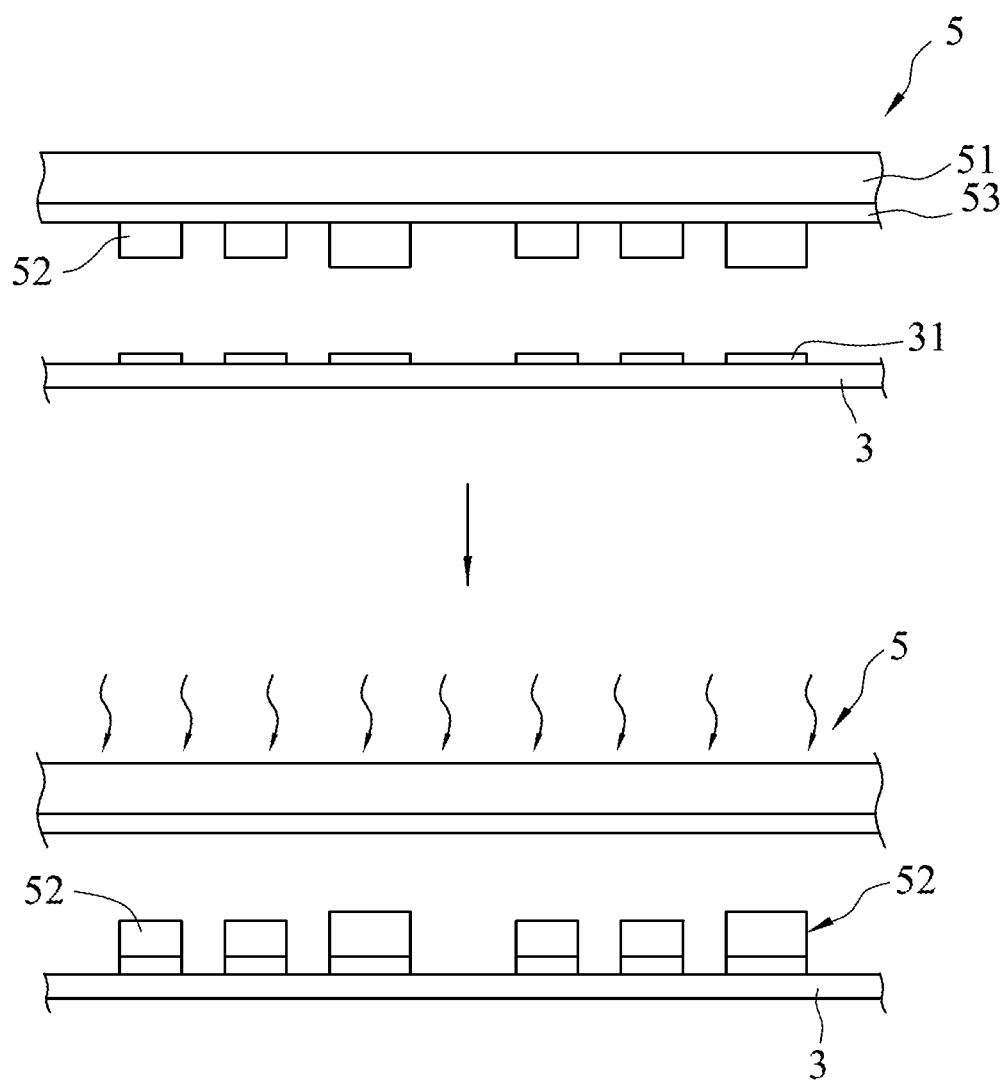
FIG. 6 is a schematic diagram illustrating consecutive steps of a third exemplary embodiment of a method for transferring light-emitting elements according to the present disclosure.

Referring to FIG. 6, the third exemplary embodiment of the method for transferring light-emitting elements according to the present disclosure is shown to be similar to that of the first exemplary embodiment. The difference therebetween resides in that the light-emitting elements 52 of the third exemplary embodiment are connected to the supporting substrate 51 through a connecting layer 53. To be specific, the supporting substrate 21 may be a substrate made of glass, polycarbonate, acrylic, sapphire or blue tape, and the connecting layer 53 is made of an alloy, such as AuSn, AlIn, or AuIn, and has a eutectic temperature ranging from 150° C. to 300° C. As such, Step (C) of the third exemplary embodiment may be conducted by heating up the connecting layer 53 to a temperature that is above the eutectic temperature of the connecting layer 53, so as to melt the connecting layer 53 and to enable the light-emitting elements 52 to be disconnected therefrom. In other embodiments, the connecting layer 53 may also be a thermal release tape that may exhibit a reduction in adhesive strength after being heated up to a temperature above a predetermined temperature.

To sum up, by utilizing the non-contact transferring method to transfer the light-emitting elements 22, 42, 52 onto the package substrate 3 by gravitationally falling to facilitate the connection between the light-emitting elements 22, 42, 52 and the connecting elements 31, the contact pressing step in the conventional transferring method can be omitted. As such, the aforementioned problem of the conventional method due to the different heights of the light-emitting elements can be prevented.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for transferring light-emitting elements onto a package substrate, comprising:
    providing a light-emitting unit including a supporting substrate and a plurality of light-emitting elements, each of the light-emitting elements being removably connected to the supporting substrate and having a surface opposite to the supporting substrate;
    disposing the light-emitting unit spacingly above a package substrate in such a manner that the surface of each of the light-emitting elements faces the package substrate; and
    disconnecting the light-emitting elements from the supporting substrate to allow the light-emitting elements to fall onto the package substrate by gravity,
    wherein the package substrate includes a plurality of connecting elements disposed correspondingly in position between the light-emitting elements and the package substrate for electrically interconnecting the light-emitting elements and the package substrate, and
    wherein, after said disconnecting, each of the light-emitting elements falls onto and contacts a corresponding one of the connecting elements.

2. The method of claim 1, wherein the step of disconnecting the light-emitting elements is conducted in a chamber under a pressure that is less than 760 torr.

3. The method of claim 1, wherein the light-emitting elements at least include a first group of the light-emitting elements and a second group of the light-emitting elements, the second group of the light-emitting elements having a height from the supporting substrate that is different from that of the first group of the light-emitting elements.

4. The method of claim 1, wherein the package substrate is one of a printed circuit board, a thin film transistor (TFT) substrate, and a complementary metal-oxide-semiconductor (CMOS) substrate.

5. The method of claim 1, wherein the connecting elements are made of an alloy having a eutectic temperature ranging from 150° C. to 300° C.

6. The method of claim 1, wherein the supporting substrate is a light release tape, and the step of disconnecting the light-emitting elements from the supporting substrate is conducted by irradiating the supporting substrate with a light having a predetermined wavelength.

7. The method of claim 1, wherein the light-emitting elements are connected to the supporting substrate through magnetic attraction, and the step of disconnecting the light-emitting elements from the supporting substrate is conducted by diminishing the magnetic attraction.

8. The method of claim 1, wherein the light-emitting elements are connected to the supporting substrate through a connecting layer.

9. The method of claim 8, wherein the connecting layer is made of an alloy having a eutectic temperature ranging from 150° C. to 300° C., and the step of disconnecting the light-emitting elements from the supporting substrate is conducted by heating the connecting layer so as to melt the connecting layer.

* * * * *